(12) United States Patent
Peng

(10) Patent No.: US 6,375,194 B1
(45) Date of Patent: *Apr. 23, 2002

(54) METHOD FOR SEMICONDUCTOR WAFER PROCESSING SYSTEM

(75) Inventor: Jyh Wen Peng, Chu Tung (TW)

(73) Assignee: Mosel Vitelic, Inc., Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/701,943

(22) Filed: Aug. 23, 1996

(51) Int. Cl.⁷ .............................. F16J 15/10
(52) U.S. Cl. .................................... 277/314
(58) Field of Search .................. 277/314, 608, 277/616, 627, 652, 654, 910, 944, 945, 614, 641, 642; 285/336, 349, 911, 368, 347, 305

(56) References Cited

U.S. PATENT DOCUMENTS

| | | | | |
|---|---|---|---|---|
| 1,047,063 A | * | 12/1912 | Irving et al. | 285/347 |
| 1,109,042 A | * | 9/1914 | Claflin | 285/347 |
| 2,509,119 A | * | 5/1950 | Warren | 285/349 |
| 3,284,107 A | * | 11/1966 | West | 285/336 |
| 3,332,710 A | * | 7/1967 | Doty | 285/336 |
| 3,499,670 A | * | 3/1970 | De Woody | 285/911 |
| 3,544,138 A | * | 12/1970 | Von Eiff | 285/336 |
| 3,746,348 A | * | 7/1973 | Stone | 285/349 |
| 3,775,832 A | * | 12/1973 | Werra | |
| 3,794,361 A | * | 2/1974 | Westberg | 285/336 |
| 4,375,290 A | * | 3/1983 | Zucchi et al. | |
| 4,432,572 A | * | 2/1984 | Thalmann | 285/368 |
| 4,557,609 A | * | 12/1985 | Morén | |
| 4,583,749 A | * | 4/1986 | Hatch | |
| 4,627,646 A | * | 12/1986 | Kessel | 285/336 |
| 4,900,063 A | * | 2/1990 | Baarfusser et al. | 285/336 |
| 5,011,196 A | * | 4/1991 | Sabatier et al. | 277/614 |
| 5,163,692 A | * | 11/1992 | Schofield et al. | |
| 5,359,148 A | * | 10/1994 | Okase et al. | 285/911 |
| 5,722,667 A | * | 3/1998 | Lim et al. | |
| 5,777,300 A | * | 7/1998 | Homma et al. | |
| 5,824,909 A | * | 10/1998 | Kathan et al. | 73/706 |
| 5,879,789 A | * | 3/1999 | Dolan et al. | 277/946 |
| 6,022,052 A | * | 2/2000 | Dunn | 285/911 |

FOREIGN PATENT DOCUMENTS

FR 1419014 * 10/1965 ................. 285/911

* cited by examiner

Primary Examiner—Anthony Knight
Assistant Examiner—John L. Beres
(74) Attorney, Agent, or Firm—Townsend and Townsend and Crew, LLP

(57) ABSTRACT

An apparatus and related method for preventing leakage of process gases or liquids from a semiconductor wafer processing system, such as an oxidizing furnace. A specific embodiment of the present invention provides a method of preventing leakage of process gases or liquids from a joint of external piping and piping in a semiconductor wafer processing system. The method includes installing as the external piping a tube. The tube has a flange shaped to accommodate an O-ring. The method also includes providing an O-ring for use with the flange, and fastening the O-ring between the flange and the piping with a fastening mechanism to prevent leakage of process gases or liquids from the joint. Yet another embodiment provides a retrofit to existing external piping. A further embodiment provides an apparatus for processing semiconductor substrates that includes use of the O-ring, fastening mechanism and tube with flange.

19 Claims, 6 Drawing Sheets

B-O-B'

E-E

F-F

METHOD FOR SEMICONDUCTOR WAFER PROCESSING SYSTEM

BACKGROUND OF THE INVENTION

The present invention relates to the processing of semiconductor wafers. More particularly, the present invention relates to an improved apparatus for processing semiconductor integrated circuits. Merely by way of example, the present invention is illustrated for an oxidation furnace, but it will be recognized that the invention has a wider range of applicability.

Semiconductor integrated circuits currently being manufactured follow ultra high density (e.g., about 0.5 to 0.35 micron) design rules, and circuits manufactured in the near future will follow even smaller design rules. As device size decreases and integration increases, the demands on fabrication and corresponding equipment are increasing.

For example, one important step in the fabrication of modern semiconductor devices is forming oxides with defined thicknesses and quality. Fabrication of such devices often requires accurate control of oxide thickness. Techniques for growing an oxide, such as silicon dioxide ($SiO_2$), include using low temperature processing in a high pressure environment or using high temperature processing in an atmospheric environment. It is recognized that the control of temperature, pressure and process gases in the furnace system is often important in controlling growth and quality of the oxide.

In an oxidizing furnace, the process gases may include, for example: oxygen ($O_2$), hydrogen ($H_2$) or water vapor ($H_2O$), nitrogen ($N_2$), trichloroethane (TCA) or Trans LC or hydrogen chloride (HCl), and argon (Ar). It is desirable that the leakage of process gases to or from the furnace system via pipes is minimized.

Leakage of process gases causes uncertainty as to flows necessary for controlled oxide growth. Also, process gas leakage may cause instability in the furnace system, possibly adversely affecting the growth or quality of the oxide. Leakage of process gases including TCA, for example, also may be environmentally undesirable.

Further, leakage of process gases from joints in the pipes connected to the oxidizing furnace may result in increased corrosion in the piping. The corrosion caused by such leakage often undesirably introduces impurities into the oxide being grown. Preventing oxide film quality degradation due to impurities from the corrosion is very important in producing devices that need to meet specified requirements. This corrosion also often involves increasing the amount of cleaning required to maintain the piping to the furnace system. In cases of extreme corrosion, the equipment or the piping may need to be replaced. Often time-consuming, the cleaning and/or replacement procedures constitute a serious, albeit necessary, interruption in the manufacturing of integrated circuits. Such an interruption in the continuous production of substrates in the manufacturing line may have a serious economic impact. Reducing total unproductive time increases the total number of wafers produced. Thus, it is desirable that leakage of process gas be minimized as efficiently and economically as possible.

From the above, it is seen that an improved apparatus for use in processing semiconductor wafers that economically and effectively minimizes process gas leaks is needed.

SUMMARY OF THE INVENTION

According to a specific embodiment, the present invention provides an apparatus for use with a semiconductor processing system having process gases or liquids through piping having a flat flange. The apparatus includes an O-ring, and a tube having an inner diameter and a flange at an end of the tube. The flange has an inner edge adjacent the inner dimension and an outer edge defining an outer dimension of the flange. The flange also has a level difference between the inner edge and the outer edge, where the inner edge is flat to contact the flat flange of the piping to permit smooth flow of the process gases or liquids through the piping and the tube. Also, the level difference provides the flange the capability to accommodate the O-ring between the flat flange and the outer edge of the flange. The apparatus further includes a fastening mechanism that tightly fastens a joint of the flat flange, the O-ring and the flange, to prevent leakage of the process gases or liquids from the joint.

According to another embodiment, the present invention provides a method of preventing leakage of process gases or liquids from a joint of external piping and piping in a semiconductor processing system. The method includes installing as the external piping a tube. The tube has a flange shaped to accommodate an O-ring. The method also includes providing an O-ring for use with the flange, and fastening the O-ring between the flange and the piping with a fastening mechanism to prevent leakage of process gases or liquids from the joint.

Yet another embodiment provides a retrofit to existing external piping. The present method includes additional steps of removing external piping from the joint, and machining the external piping to form the flange shaped to accommodate an O-ring. Accordingly, the installing step uses the machined external piping as the tube.

A further embodiment provides an apparatus for processing semiconductor substrates. The apparatus includes an internal housing having conduits for dispersing process gases or liquids into the internal housing. The internal housing is capable of providing heat for the processing of substrates. The apparatus also includes an outer encasement surrounding a portion of the internal housing to form a space for containing process gases for use in the internal housing. The internal housing also has first piping for transferring process gases or liquids, and second piping, integral to the internal housing and the outer encasement, also for transferring process gases to the space. The apparatus further includes an O-ring, and a tube connected to the first or second piping. The tube has a flange shaped to hold the O-ring against the piping and against only an outer portion of the flange. The apparatus further includes a fastening mechanism tightly connecting the piping and the flange to sandwich the O-ring, and leakage of process gases or liquids from a joint of the piping, the O-ring, and the flange is prevented.

The present invention achieves these benefits in the context of an oxidizing furnace. However, a further understanding of the nature and advantages of the present invention may be realized by reference to the latter portions of the specification and attached drawings.

BRIEF DESCRIPTION OF THE DRAWINGS

FIG. 1(*b*) is an opened-up cross-sectional view along the length of the exemplary semiconductor oxidizing furnace of FIG. 1(*a*);

FIG. 1(*c*) is a cross-section of the side view of the exemplary oxidizing furnace;

DESCRIPTION OF SPECIFIC EMBODIMENTS

The present invention prevents the leakage of process gases (as well as other related problems) via piping of a semiconductor processing system such as, for example, an oxidizing furnace. FIGS. 1(a)–1(d) illustrate different views of an exemplary oxidizing furnace with which the present invention may be used.

Figure 1A:
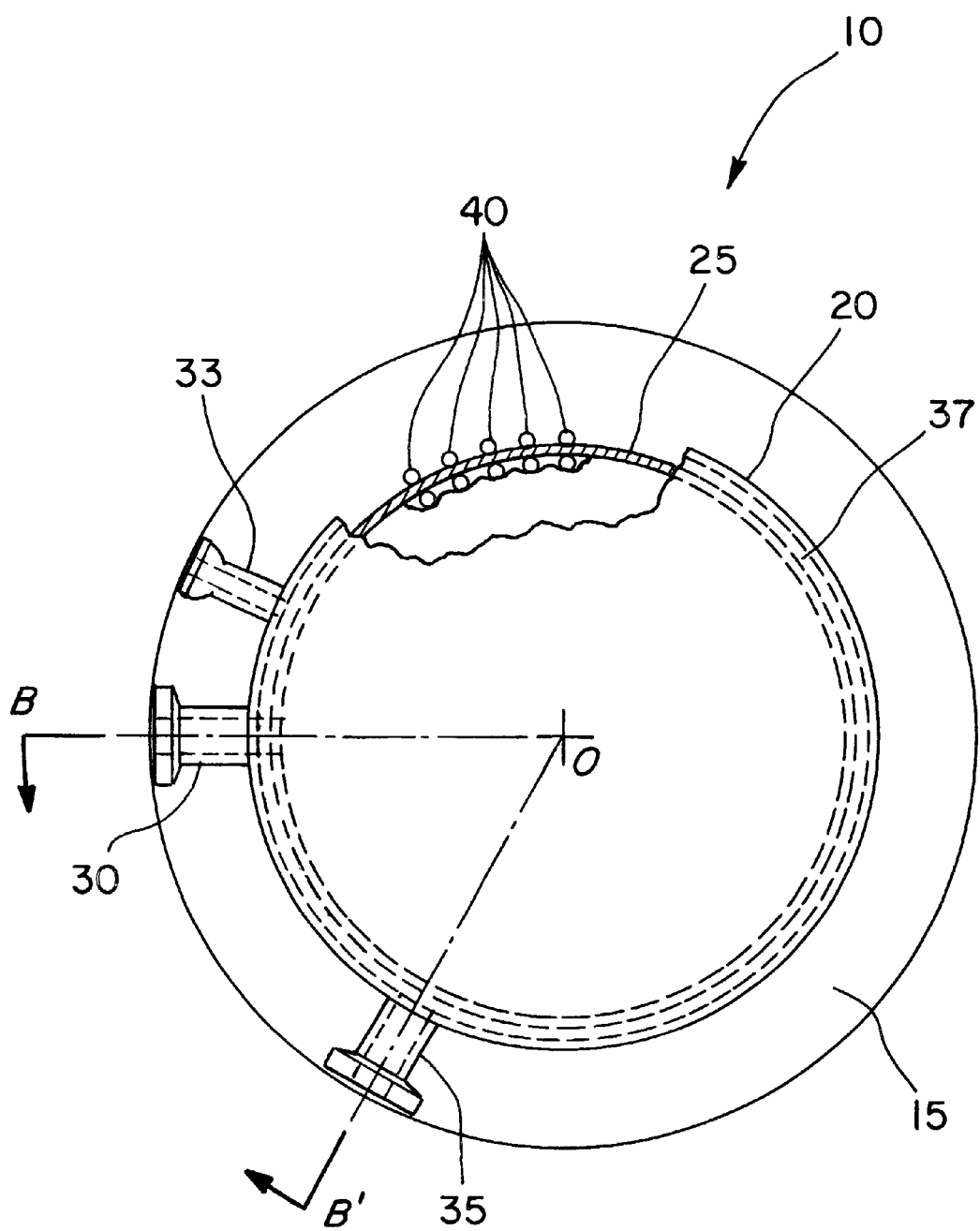
FIG. 1(*a*) is a side view of an exemplary oxidizing furnace in accordance with the an embodiment of the present invention.
FIG. 1(d) is a cross-section of the side view of the exemplary oxidizing furnace.
FIG. 1(e) is a detailed cross-sectional view of piping 35 of the exemplary oxidizing furnace.
Figure 1B:
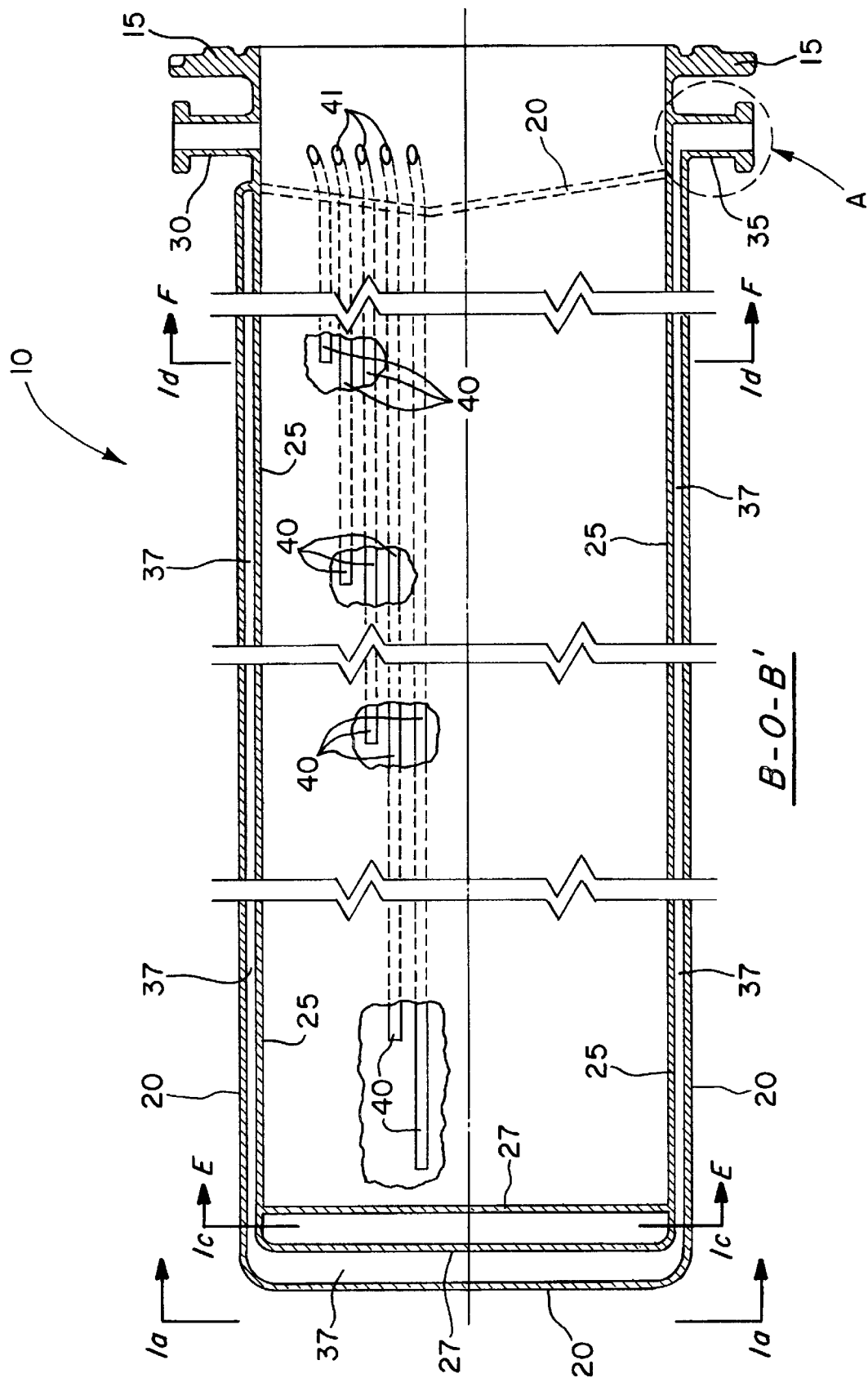

FIG. 1(a) is a side view of an exemplary oxidizing furnace 10 in accordance with the an embodiment of the present invention. FIG. 1(b) is an opened-up (B-O-B') cross-sectional view along the length of exemplary semiconductor oxidizing furnace 10 of FIG. 1(a). As an example, furnace 10 may be a double wall tube furnace. Generally, furnace 10, which is cylindrically shaped with an openable end and a closed end, has an interior surface and an exterior surface. Semiconductor wafers in a boat may be loaded into furnace 10 through the openable end and oxidized using process gases and high temperature in an atmospheric system or low temperature in a closed vacuum system. Furnace 10 includes a circular outer flange 15 at its openable end, and an outer body encasement 20 which contains an interior housing 25. Outer body encasement 20 and interior housing 25 preferably may be made of quartz, but other materials may be used. Interior housing 25 may be a high temperature ceramic material wound with internal heating elements. Of course, the openable end of furnace 10 is able to be closed and sealed with a door after the semiconductor wafers have been loaded into the openable end for processing. Circular outer flange 15 is integral with interior housing 25 such that interior housing 25 and the inner surface of flange 15 form the interior surface of furnace 10.

Figure 1C:
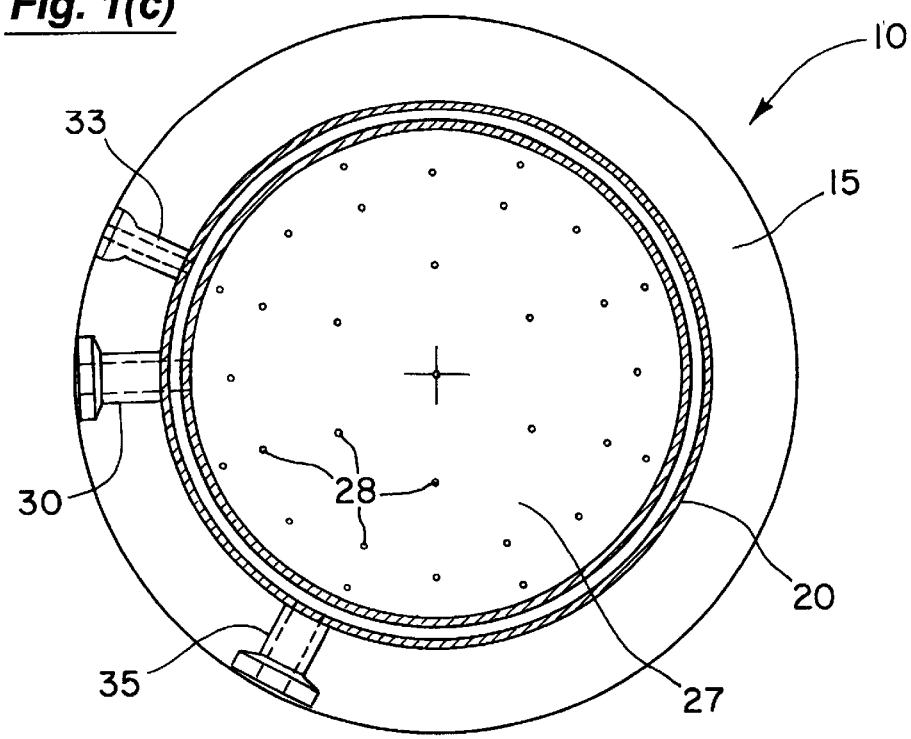

Outer body encasement 20 is concentric to and surrounds interior housing 25 along most of the length of interior housing 25. Outer body encasement 20 is not gas permeable. Interior housing 25 has a permeable double wall 27 at the closed end. FIG. 1(c) is a cross-section of the side view of the exemplary oxidizing furnace at a point (E—E) between the outer wall and permeable wall 27 of interior housing 25, near the closed end. As seen in FIG. 1(c), wall 27 has various small holes 28 (preferably, laser drilled holes) which make wall 27 permeable to the process gases. Outer body encasement 20 also has an outer wall that covers permeable wall 27 of interior housing 25 at the closed end.

Figure 1D:
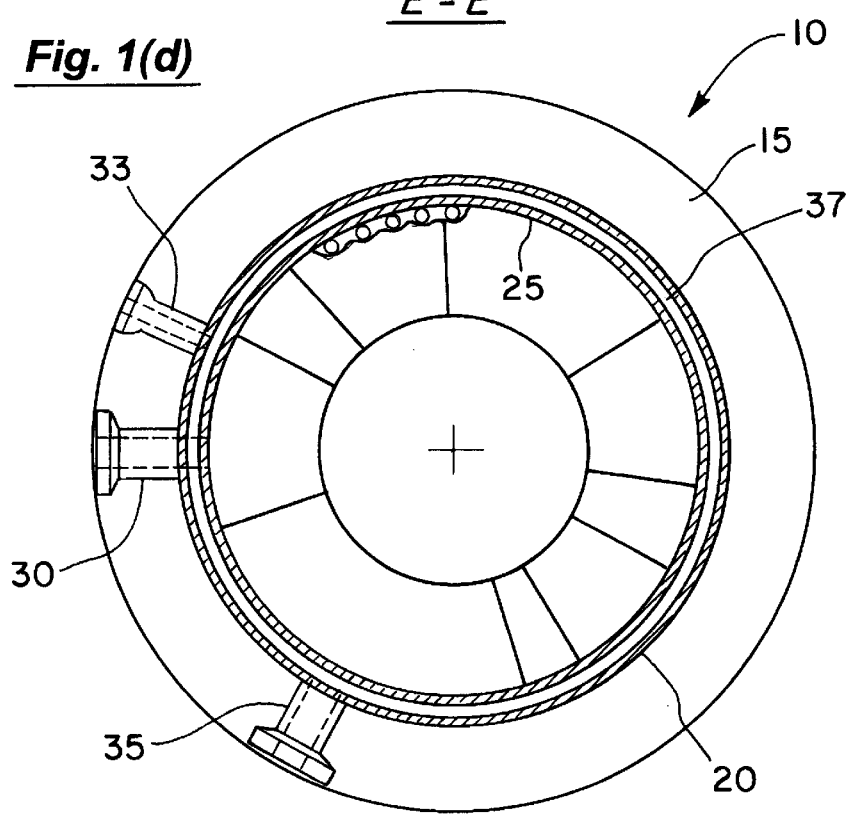

Furnace 10 also includes piping 30, piping 33, and piping 35 located before outer flange 15 at the open end. There is a space 37 separating outer body encasement 20 and interior housing 25 through which process gases (vapors) or liquids eventually may be dispensed to the interior of furnace 10. Piping 30, which is integral to interior housing 25, is the outlet process exhaust gases from the interior of furnace 10. Integral on its external surface to outer body encasement 20 and on its interior surface to space 37, piping 33 acts as an exhaust pipe, sometimes commonly referred to as a "scavenge" exhaust. Piping 35, integral to interior housing 25 and to outer body encasement 20, introduces process gases into the interior of furnace 10. In particular, process gases such as, for example, nitrogen, Trans LC, argon and other gases, enter furnace 10 through space 37 from piping 35. Preferably, piping may be made of quartz ($SiO_2$), but other materials such as ceramic, metal, or the like may be sued. Often, parts of furnace 10 and external connecting piping that are proximate to piping (30, 33, 35) are made of stainless steel, which may corrode. Outer body encasement 20 stops short of completely surrounding interior housing 25, thereby avoiding piping 30 and 33 and outer flange 15 near the open end. FIG. 1(d) is a cross-section of the side view of the exemplary oxidizing furnace at a point (F—F) before the piping 30, 33, 35 and outer flange 15, near the open end.

Conduits 40, each of different lengths, line a top and bottom portion of interior housing 25 within space 37, as seen in FIG. 1(b). Piping 35 provides process gases or liquids to space 37 for transfer to conduits 40 and to the interior of furnace 10. Conduits 40 have openings 41 which receive process gases or liquids from space 37 for eventually dispensing into the interior of furnace 10. Each conduit 40 dispenses the process gases or liquids via small holes along the length of the conduit. Accordingly, conduits 40, each of different lengths, are able to dispense process gases or liquids in the different regions in order to form an oxide of controlled thickness at the appropriate temperature and pressure. Process gases also flow from space 37 through permeable wall 27 at the closed end of interior housing 25 into the interior of furnace 10. Holes 28 in permeable wall 27 provide for better oxide film uniformity. The used process gases within interior housing 25 exit furnace 10 through piping 30.

Leakage of process gases or liquids, such as for example Trans LC used for gettering of metal ions (e.g., sodium ($Na^+$), potassium ($K^+$), etc.) during the silicon oxidation process, causes corrosion of the stainless steel material proximate to the various piping (30, 33, 35) of furnace 10 or in the external piping to which the furnace piping forms joints. Typically, this corrosion begins shortly after the usage of Trans LC as one of the process gases, leading to the almost immediate risk of oxide degradation.

The present invention provides an efficient and economic apparatus and method for equipping piping of furnace 10 with a joint to improved piping for minimizing leakage of process gases. Of course, although the present description is described primarily with regard to piping 35, it is recognized that the present invention may also be applicable to any piping in the processing system, such as piping 30 and/or piping 33. The present invention may be used when piping is initially installed or as a retrofitting.

Figure 1E:
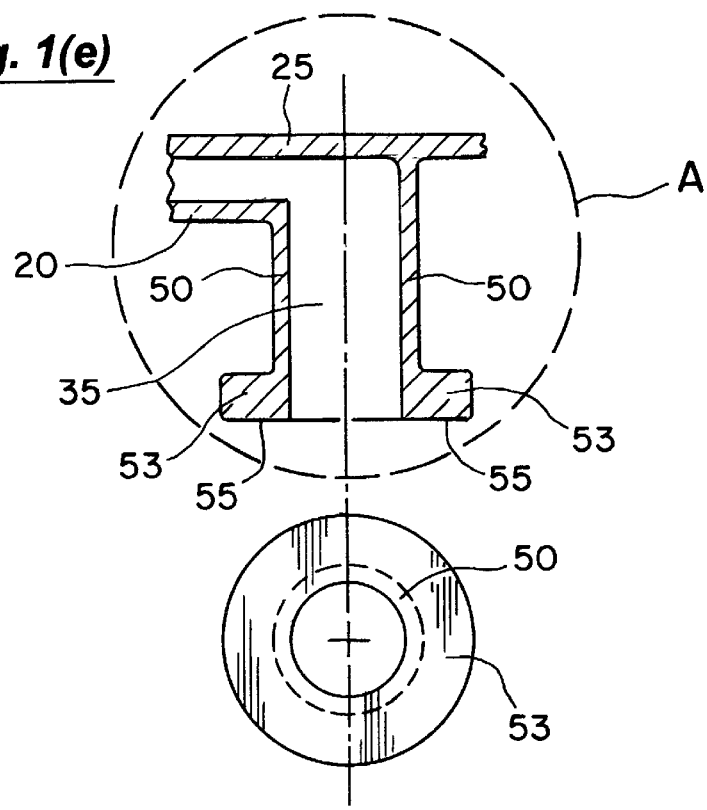

As seen in FIG. 1(e) which is a detailed cross-sectional view A of piping 35, piping 35 is a circular tube 50 with a protruding flange 53 which has a flat surface 55 and a circular diameter in the presently described embodiment. Of course, other embodiments may use piping with non-circular tubing and flanges, such as polygonal tubing and flanges.

Figure 2A:
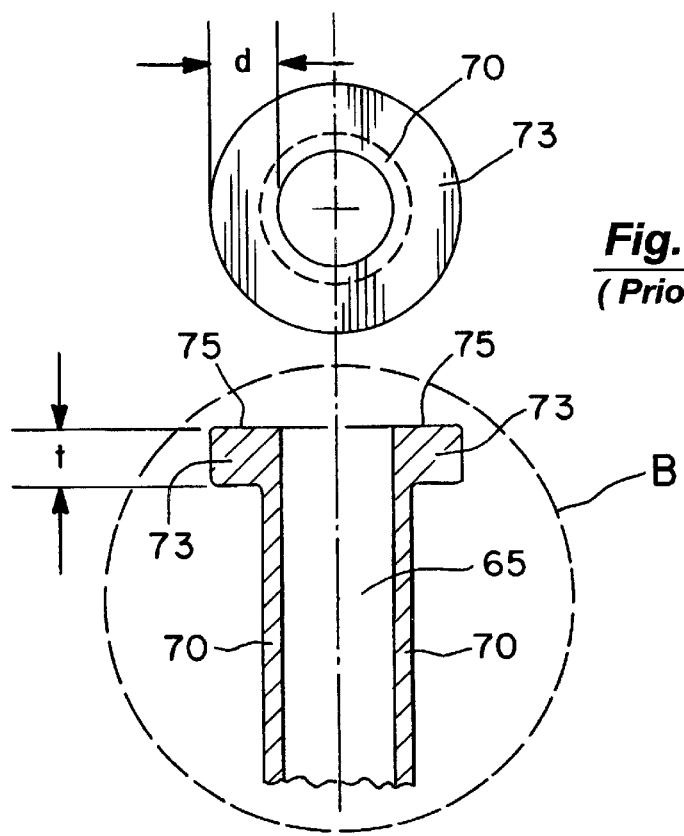
FIG. 2(a) is a detailed view of a prior art piping 65 which is used in conjunction with piping 35 of the furnace to exhaust used process gases out of the furnace to an exhaust system for collection and disposal.
Figure 2B:
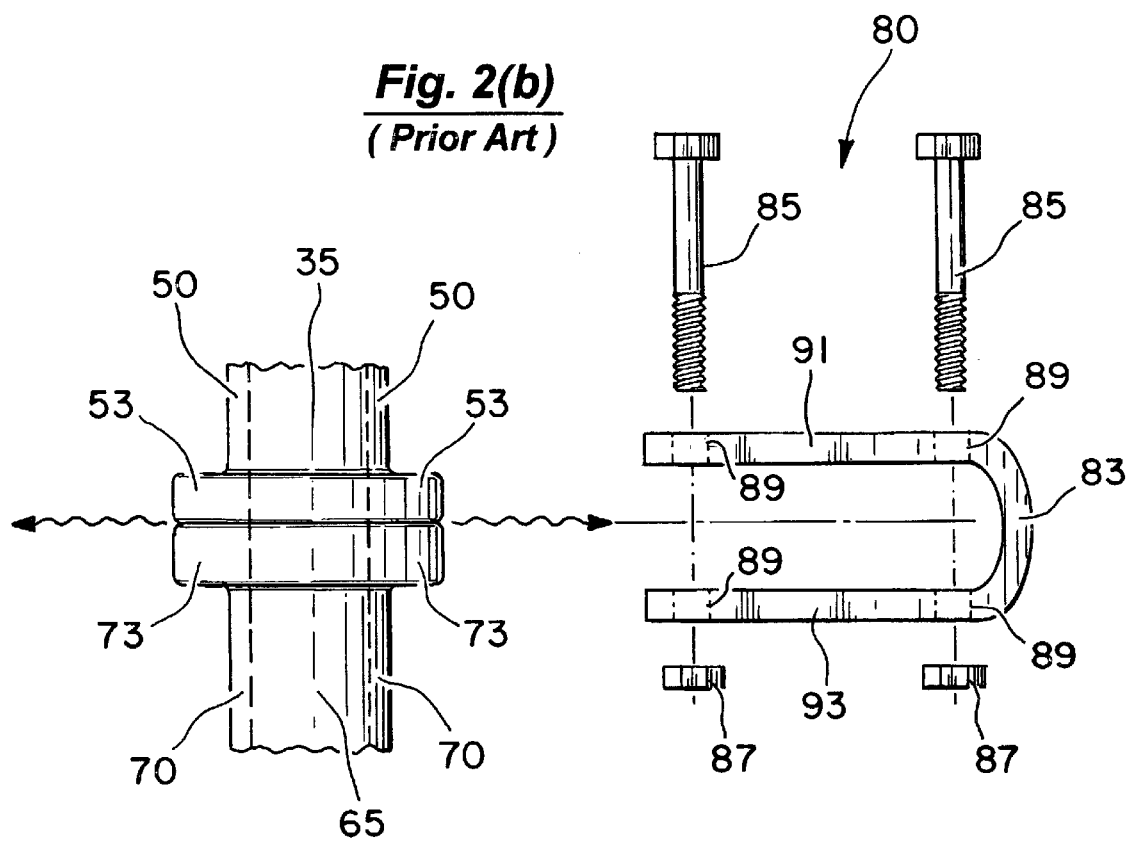
FIG. 2(b) is a view of the joint of piping 35 and prior art piping 65 with a fastening mechanism 80 (shown unfastened) used to tighten the joint for attempting to prevent gas leakage at the joint.
Figure 2C:
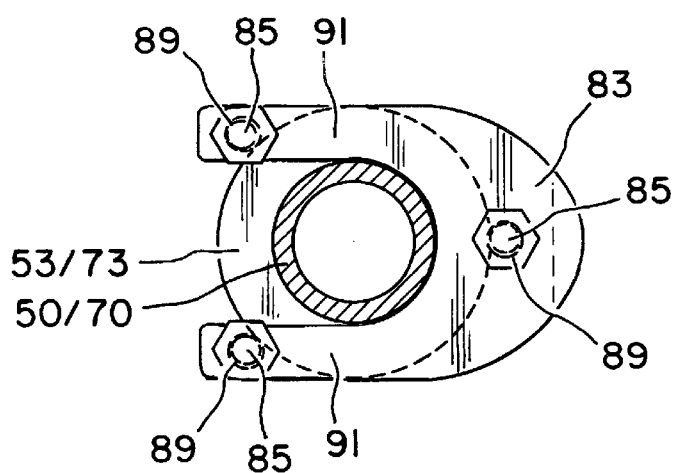
FIG. 2(c) is a top view of the joint of piping 35 and prior art piping 65 with fastening mechanism 80 (shown fastened)

FIGS. 2(a)–2(c) are different views of a conventional piping 65 that may be used with piping 35 (or piping 30) of furnace 10. FIG. 2(a) is a detailed view B of a conventional piping 65 which is used in conjunction with piping 35 of furnace 10 to introduce process gases into furnace 10 for oxidizing wafers. Piping 65 is similar in shape to piping 35. Piping 65 is a circular tube 70 with a protruding flange 73 which has a flat surface 75 and a circular diameter. Flange 73 has a thickness "t" of about 7 millimeters (mm), and a protruding distance "d" of about 10.5 mm. Of course, other systems may have different dimensions for piping.

FIG. 2(b) is a view of the joint of piping 35 and piping 65 with a fastening mechanism 80 (shown unfastened) used to tighten the joint for attempting to prevent gas leakage at the joint. In connecting piping 65 to furnace 10, flat surface 75 of piping 65 contacts flat surface 53 of piping 35. Because piping 65 and piping 35 are practically mirror-image counterparts, tube 50 and tube 70 collectively form a tube with a matching internal surface wall for smooth exhaust gas flow. According to a specific embodiment, fastening mechanism 80 includes a clamp 83 with screws 85 and bolts 87.

FIG. 2(c) is a top view of the joint of piping 35 and piping 65 with fastening mechanism 80 (shown fastened). Clamp 83 is a U-shaped, four-prong clamp having two top prongs 91 and two bottom prongs 93. Top prongs 91 and bottom prongs 93 are integral with a bent, semi-flexible mid-section to form clamp 83. The distance between top prongs 91 and bottom prongs 93 should be approximately equal to or slightly greater than the added thicknesses of flanges 53 and 73. Top prongs 91 and bottom prongs 93 have holes 89 at their ends through which long screws 85 may be fastened using bolts 87 in order to tighten clamp 83 on the joint of piping 65 and piping 35. The mid-section of clamp 83 also has a hole 89 through which a long screw 85 may be fastened using a bolt 87 to tighten clamp 83 on the joint of piping 65 and piping 35, as seen in FIG. 2(c). However, even with the conventional piping 65 and piping 35 tightly clamped together by fastening mechanism 80, often there is some leakage of process gases from the joint of piping 65 and 35. As mentioned above, the leakage of process gases from joints in the pipes to the oxidizing furnace may result in increased corrosion in the piping and other stainless steel materials close to the joints. Corrosion leads to an increase in time-consuming and expensive cleaning and/or replacement procedures that interrupt the manufacturing of substrates, and often leads to degraded oxide quality by introducing impurities.

Figure 3A:
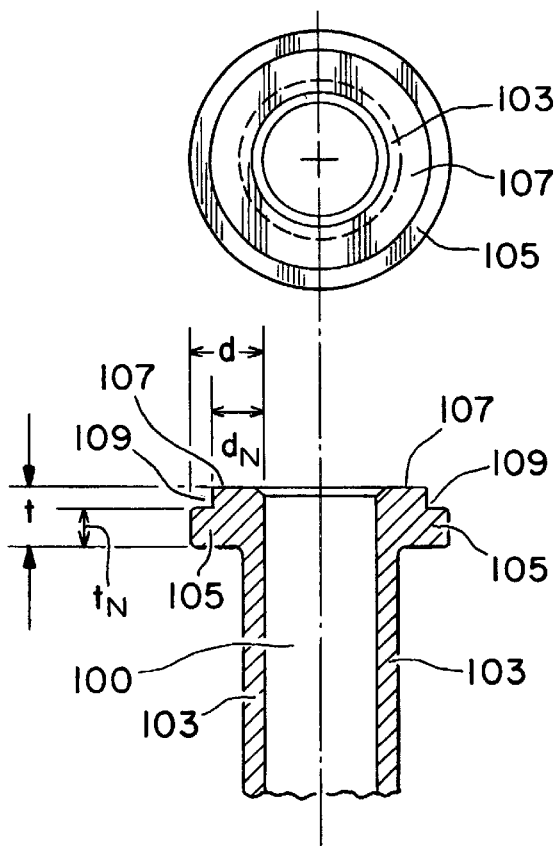
FIG. 3(a) is a detailed view of improved piping 100 which is used in conjunction with piping 35 of the furnace to exhaust used process gases out of the furnace to an exhaust system for collection and disposal, in accordance with a specific embodiment of the present invention.
Figure 3B:
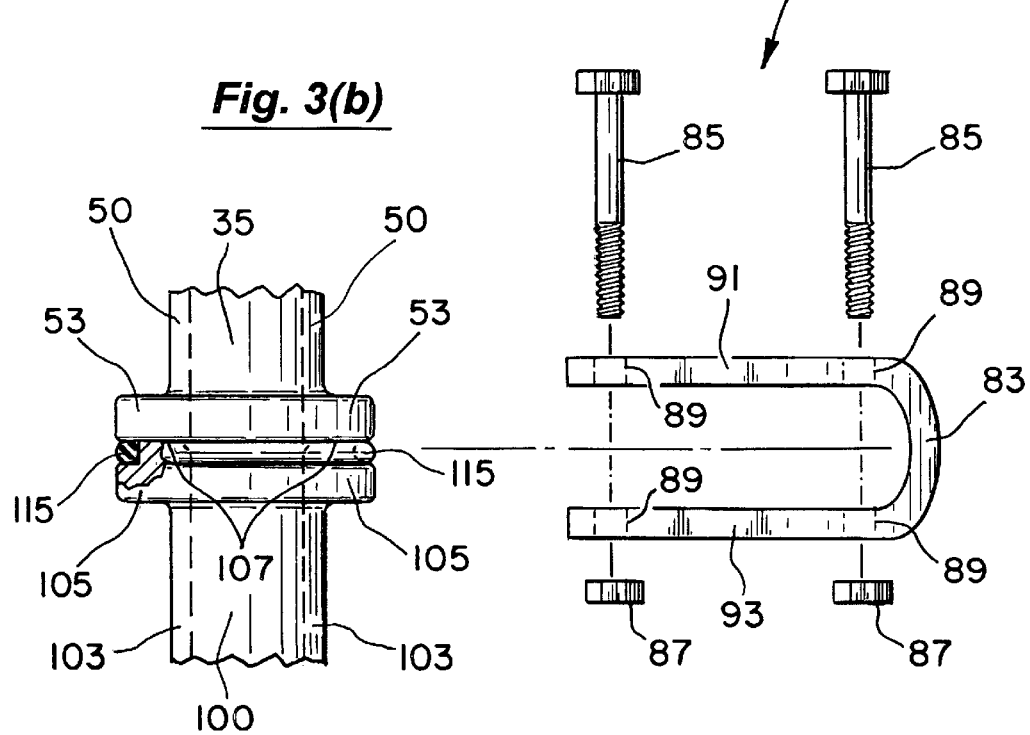
FIG. 3(b) is a view of the joint of piping 35, improved piping 100, and an O-ring, with a fastening mechanism 80 (shown unfastened) used to tighten the joint for preventing gas leakage at the joint.

FIGS. 3(a)–3(c) are different views of an improved piping 100 that may be used with piping 35 of furnace 10, according to a specific embodiment. FIG. 3(a) is a detailed view of improved piping 100 which is used in conjunction with piping 35 of furnace 10 to introduce process gases into furnace 10 for the oxidation process. Generally, piping 100 is similar in dimensions to piping 65 and piping 35. Improved piping 100 is preferably constructed of quartz, but may also be constructed of ceramic, stainless steel or other metal, or the like. Piping 100 is a circular tube 103 with a protruding flange 105 which has a flat surface 107 and a circular diameter. Flat surface 107 has a step or notch 109 around the outer portion of the circular diameter. Therefore, flange 105 has an overall thickness "t" of about 7 millimeters (mm) around the inner portion of the circular diameter, and a reduced thickness "$t_N$" of about 4 mm around the outer portion of the circular diameter. Flange 105 also has a total protruding distance "d" of about 10.5 mm, and a reduced protruding distance "$d_N$" of about 6.5 mm for the portion of flange 105 closest to the inner circular diameter. Notch 109, which is about 4 mm long and about 3 mm deep in a specific embodiment, is able to seat or accommodate an O-ring (not shown) that snugly fits around the portion of flange 105 that is not notched. Of course, it is recognized that other dimensions for improved piping 100 and O-ring 115 may be used depending on the configuration of piping 35 of a processing system such as furnace 10.

FIG. 3(b) is a view of the joint of piping 35 and improved piping 100 and an O-ring 115 with a fastening mechanism 80 (shown unfastened) used to tighten the joint for preventing gas leakage at the joint. In connecting improved piping 100 to furnace 10, flat surface 107 of piping 100 contacts the inner portion of flat surface 53 of piping 35. Tube 103 of improved piping 100 and tube 50 of piping 35 collectively form a tube with a matching internal surface wall for smooth gas flow.

According to a specific embodiment of the present invention, fastening mechanism 80 may be the same as that described above. Top prongs 91 and bottom prongs 93 have holes 89 at their ends through which long screws 85 may be fastened using bolts 87 in order to tighten clamp 83 on the joint of piping 65 and piping 35. The mid-section of clamp 83 also has a hole 89 through which a long screw 85 may be fastened using a bolt 87 to tighten clamp 83 on the joint of improved piping 100 and piping 35 which sandwiches O-ring 115. Of course, it is recognized that other types of fastening mechanisms may be used. For example, bolts may not be required if clamp 83 is equipped with threads to firmly hold screws 85 in place. With improved piping 100, O-ring 115, and piping 35 tightly clamped together by fastening mechanism 80, leakage of process gases from the joint of piping 100 and 35 may be eliminated. O-ring 115 should be constructed of a hard plastic, rubber, polymer such as teflon, or the like. O-ring 115 should preferably be non-reactive with process gases. O-ring 115 should also be able to withstand the temperatures to which the pipings of furnace 100 and the process gases may reach. In a preferred embodiment, O-ring 115 is made of a composite of two different materials. O-ring 115 has an inner core of perfluoroalkoxy (PFA), and a surrounding outer shell of fluorinated ethylene propylene (FEP). Preferably, at least the inner core of O-ring 115 has a higher melting point than the temperatures which the joint and process gases flowing therein may reach. In the present embodiment, O-ring 115, made of a composite of PFA and FEP, operates at temperatures between about 15–205° C. This embodiment is well suited to processes with process temperatures ranging from between about 850–1050° C., which result in operating temperatures at the joint of pipes of between about 200–250° C., since the PFA core of O-ring 115 has a melting point of about 260° C. Of course, other embodiments may use different materials for O-ring 115, depending on the melting point of the material used and the process temperatures with resulting operating temperatures at the joint for a specific process.

Although O-ring 115 may have a circular cross-section, as shown in FIG. 3(b), O-ring 115 may also have a square, rectangular, or other cross-section that may be suitable for preventing leakage of process gases from the joint of improved piping 100 and piping 35. Further, notch 109 may also conform to the particular shape of the O-ring seated on flange 105 of improved piping 100.

The present invention provides a simple, economic, and efficient way of preventing the leakage of process gases in a processing system like furnace 10. Preferably, improved piping 100 should be similar in overall dimensions to those of the piping to which the joint is formed. In other embodiments of the present invention, improved piping 100 may be constructed from existing piping 65 by machining a notch of appropriate dimensions to accommodate a suitable O-ring. Of course, improved piping 100 may also be molded from original material or manufactured. Improved piping 100 simply may be installed or retrofitted onto a processing system such as furnace 10 in the place of conventional piping 65 or other existing piping.

While the above is a full description of the specific embodiments, various modifications, alternative constructions and equivalents may be used. For example, while the description above is in terms of an oxidizing furnace, it would be possible to implement the present invention with other process systems where providing gases while minimizing leakage is important. As another example, different types of fastening mechanisms may be utilized with the present invention. Further, the present invention may be used with any piping in different semiconductor processing systems where leakage from a piping joint is undesirable. Still further, although discussed in terms of leakage of process gases, the present invention would also be applicable to preventing leakage of process liquids. Therefore, the above description and illustrations should not be taken as limiting the scope of the present invention which is defined by the appended claims.

What is claimed is:

1. A method of preventing leakage of process gases or liquids from a joint between an external piping and a piping in a semiconductor processing system, said method comprising:

removing said external piping from said joint;

machining said external piping to form a notch in a flange of said external piping, said notch generally rectangular in cross-section and shaped to accommodate an O-ring, and positioning said machined external pipe along a flowpath defined through said external piping and said piping;

providing an O-ring for use with said flange;

fastening said O-ring in said notch between said flange and a generally flat surface of said piping with a fastening mechanism attachable after mating said external piping and said piping to prevent leakage of process gases or liquids from said joint.

2. The method of claim 1 wherein said O-ring is a circular O-ring.

3. The method of claim 1 wherein said O-ring has a core of PFA.

4. The method of claim 3 wherein said core is surrounded by an outer shell of FEP.

5. The method of claim 1 wherein said semiconductor processing system comprises an oxidizing furnace.

6. The method of claim 1 wherein said O-ring has a circular cross-section.

7. The method of claim 1 wherein said O-ring conforms to the shape of the notch.

8. The method of claim 1 wherein said fastening mechanism comprises a clamp and a plurality of screws.

9. The method of claim 1 wherein an outer edge of said O-ring is exposed to an atmosphere surrounding said tube, said O-ring generally aligned with an outer edge of said tube.

10. A method of preventing leakage of process gas or liquids from a joint between an external piping and a piping having a flat flange, said method comprising:

removing said external piping from said joint;

forming in a flange of said external piping a notch shaped to fit an O-ring, said flange of said external piping having an inner edge adjacent the inner dimension and an outer edge defining an outer dimension of said flange of said external piping, said notch defining a level difference between said inner edge and said outer edge, said inner edge being flat to contact said flat flange of said piping to permit flow of process gases or liquids through said piping and said external piping;

providing an O-ring for use with said flange of said external piping, said O-ring having a cross-sectional diameter that is similar to said level difference; and fastening said O-ring in said notch between said flat flange and said outer edge of said flange of said external piping with a fastening mechanism attachable after mating said external piping and said piping to prevent leakage of process gases or liquids from said joint.

11. The method of claim 10 wherein said O-ring comprises a circular O-ring having a circular cross section.

12. The method of claim 10 wherein said O-ring comprises a core comprising PFA encased in a shell comprising FEP.

13. The method of claim 10 wherein said notch is generally rectangular in cross-section.

14. A method of preventing leakage of process gas or liquids from a joint between external piping and piping having a flat flange in a substrate processing apparatus, said method comprising:

providing said substrate processing apparatus comprising an internal housing having at least one conduit for dispersing process gases or liquids into said internal housing, said internal housing capable of providing heat for the processing of said substrates;

an outer encasement surrounding a portion of said internal housing to form a space, said space containing process gases for use in said internal housing;

wherein said internal housing includes a first piping for transferring process gases or liquids, and a second piping integral to said internal housing and said outer encasement also for transferring process gases or liquids to said space; and retrofitting a flange of said first or said second piping to accommodate an O-ring;

providing an O-ring for use with said retrofitted flange;

fastening said O-ring to said retrofitted flange with a fastening mechanism attachable after mating said first and said second piping so that said O-ring is maintained against a flat portion of said first or said second piping and against only an outer portion of said retrofitted flange;

wherein leakage of process gases or liquids from a joint between said first and said second piping is prevented.

15. The method of claims 14 wherein said flange is shaped conformally to said O-ring.

16. The method of claim 14 wherein said fastening mechanism comprises a clamp, and a plurality of screws.

17. The method of claim 14 wherein said O-ring is a circular O-ring.

18. The method of claim 14 wherein said O-ring is comprised of PFA.

19. The method of claim 14 wherein said tube is formed of a material selected from the group consisting essentially of quartz and ceramic.

* * * * *